United States Patent
Van Beek

(10) Patent No.: US 7,382,205 B2
(45) Date of Patent: Jun. 3, 2008

(54) TRANSDUCER AND ELECTRONIC DEVICE

(75) Inventor: Jozef Thomas Martinus Van Beek, Eindhoven (NL)

(73) Assignee: NXP B.V., Eindhoven (NL)

( * ) Notice: Subject to any disclaimer, the term of this patent is extended or adjusted under 35 U.S.C. 154(b) by 471 days.

(21) Appl. No.: 10/537,578

(22) PCT Filed: Nov. 26, 2003

(86) PCT No.: PCT/IB03/05443

§ 371 (c)(1),
(2), (4) Date: Jun. 6, 2005

(87) PCT Pub. No.: WO2004/053431

PCT Pub. Date: Jun. 24, 2004

(65) Prior Publication Data

US 2006/0114541 A1 Jun. 1, 2006

(30) Foreign Application Priority Data

Dec. 10, 2002 (EP) .................................. 02080220

(51) Int. Cl.
*H03H 9/02* (2006.01)

(52) U.S. Cl. ................. 331/154; 331/116 M; 333/187; 310/309

(58) Field of Classification Search ................ 331/154, 331/116 M; 333/187, 186; 310/309
See application file for complete search history.

(56) References Cited

U.S. PATENT DOCUMENTS

| | | | | |
|---|---|---|---|---|
| 3,487,220 A | * | 12/1969 | Buchy et al. | ............. 250/214.1 |
| 3,614,678 A | * | 10/1971 | Engeler et al. | ............. 333/187 |
| 3,652,955 A | * | 3/1972 | Cruger et al. | ........... 331/116 M |
| 4,291,283 A | * | 9/1981 | Castera | ........................ 331/96 |
| 5,188,983 A | * | 2/1993 | Guckel et al. | ................ 438/53 |
| 2003/0052742 A1 | * | 3/2003 | Niu et al. | ................... 331/154 |

OTHER PUBLICATIONS

"A 12 MHz Michromechanical Bulk Acoustic Mode Oscillator", by T. Mattila et al.

* cited by examiner

*Primary Examiner*—Joseph Chang
(74) *Attorney, Agent, or Firm*—Peter Zawilski

(57) ABSTRACT

The transducer (1) comprises an electrically conductive resonator element (20) extending in a longitudinal direction having a length (l). It can be elastically deformed by an electrically conductive actuator (30) such that the elastic deformation comprises a change of the length (dl). The resonator element (20) is electrically connected to a first contact area (25) and a second contact area (26) thereby constituting a circuit In this circuit the resonator element (20) constitutes a resistor with an ohmic resistance (R) which is a function of the length (l+dl). The transducer (1) further comprises a measurement point (28) electrically connected to the circuit for providing an electrical signal which is a function of the resistance (R).

14 Claims, 8 Drawing Sheets

TRANSDUCER AND ELECTRONIC DEVICE

The invention relates to an electromechanical transducer for transducing an electrical input signal into an electrical output signal, the transducer comprising a substrate, an electrically conductive resonator element attached to the substrate, the resonator element extending in a longitudinal direction having a length l, an electrically conductive actuator able to receive an electrical actuation potential difference with respect to the resonator element for elastically deforming the resonator element, the actuation potential difference being a function of the input signal, the elastic deformation comprising a change dl of the length, the resonator element being part of a circuit which is able to provide the output signal, the output signal being a function of the change dl of the length l.

The invention further relates to an electronic device comprising a signal processor operating with a clock signal, and a transducer according to the invention for providing the clock signal.

The article "A 12 MHz micromechanical bulk acoustic mode oscillator" by T. Mattila et al., Sensors and Actuators A, volume 101, page 1-9, 2002 discloses an electromechanical transducer.

Such a transducer is able to transduce an electrical input signal into an electrical output signal. It comprises a resonator element which is a beam extending in a longitudinal direction having a length l of μm dimensions. The beam is clamped to the substrate at its central part and, except for this central part, is free to move with respect to the substrate, i.e. it can be deformed in, e.g., the longitudinal direction. The motions of the beam away from its equilibrium position are counteracted by an elastic force. This elastic force and the mass of the resonator element determine the eigenfrequency of the resonator element.

The known transducer comprises an electrically conductive actuator for inducing an elastic deformation of the resonator element. The actuator has two electrodes with surfaces facing the beam at its outer ends in the longitudinal direction. The actuator can be provided with an electrical actuation potential difference with respect to the resonator element, the actuation potential difference being a function of the input signal. In the known transducer, the actuation potential difference comprises an AC component and a DC component, the AC component being the input signal.

The surface of the electrodes and the outer ends of the resonant element constitute a capacitor. When an actuation potential difference is applied, they therefore exert an electrostatic force on each other leading to an elastic deformation of the beam. This elastic deformation comprises a change dl of length l. Due to this elastic deformation the distance between the electrodes and the outer ends of the beam constituting the capacitor, which is often referred to as the gap g, changes and additional charges are induced on the outer ends of the beam.

The resonator element is part of a circuit in which these induced charges are measured in order to generate an electrical output signal which is a function of the change dl of length l. The amount of induced charges and thus the amplitude of the output signal depends on the size of the gap g and, therefore, on the deformation of the beam: the smaller the gap, the larger the signal. Therefore, the output signal can be used to capacitively measure the change dl of length l.

Periodically changing the electrical actuation potential difference leads to a periodical deformation of the beam. When the electrical actuation potential difference is changed with a frequency that substantially matches an eigenfrequency of the beam, the beam is brought into mechanical resonance, which leads to a relatively large deformation and a correspondingly large output signal.

It is a disadvantage of the known transducer that the output signal is relatively small.

It is an object of the invention to provide a transducer, which is able to provide a relatively large output signal.

The invention is defined by the independent claims. The dependent claims define advantageous embodiments.

According to the invention the object is achieved in that the resonator element constitutes a resistor with an ohmic resistance R which is a function of the change dl of length l, the output signal being a function of resistance R.

The transducer according to the invention has a circuit which comprises the resonator element constituting a resistor. The resistor has a resistance R which is a function of the elastic deformation dl. It may comprise, e.g., any type of piezoresistive material. The circuit is able to provide an output signal which is a function of the resistance R and hence, of the change dl of the length l. The output signal may be obtained, e.g., by measuring the resistance R. The resistance R may be measured by various techniques known in the art. In one embodiment the voltage drop V over the resistor is measured by monitoring the electrical potential difference between a measurement area that is electrically connected to the circuit, and a reference area. The positions of the measurement area and the reference area are not critical as long as their mutual electric potential difference is at least partly determined by the voltage drop over the resistor. In another embodiment the circuit is provided with a constant voltage and the current I through the resistor is measured.

In the transducer according to the invention the resonator element can be deformed by capacitively coupling it to the actuator analogously to the known transducer. In contrast to the known transducer, the transducer according to the invention uses the piezoresistive effect for measuring the deformation. This capacitive excitation—resistive detection scheme is more sensitive than the known capacitive excitation—capacitive detection scheme, in particular for transducers with a relatively high eigenfrequency. It may be shown that the output signal of a transducer according to the invention is larger than that of the known transducer by more than a factor of 100 provided that both transducers have the same dimensions and that both are provided with the same actuation potential difference as the known transducer.

When designing a transducer with a higher eigenfrequency, the resonator element has to be smaller and stiffer. In this case, the output signal of the known transducer becomes smaller because it scales linearly with the width and the height of the resonator element. In contrast to this, the relative change of the ohmic resistance dR/R and hence the output signal of the transducer according to the invention are independent of the resonator dimensions as long as the shape of the resonator element, i.e. the ratios of the length to thickness and of the length to width are maintained. This feature of the transducer according to the invention forms an important additional advantage, because it allows for manufacturing a relatively high-frequency transducer that is able to provide a relatively large signal.

The transducer according to the invention further has the advantage that the output signal is less dependent on the size of the gap g: the output signal of the known transducer scales with $1/g^4$, whereas the output signal of the transducer according to the invention scales with $1/g^2$. Therefore, in the transducer according to the invention often larger gaps can be used.

It should be noted that the invention is not limited to beam-shaped resonator elements as will be shown by examples discussed below. Neither is it essential that the resonator element is attached to the substrate in the central part. The only requirements for a resonator element of a transducer according to the invention are that it extends in a longitudinal direction having a length l, the elastic deformation comprises a change dl of the length l, and that the resonator element is part of a circuit in which it constitutes a resistor with an ohmic resistance R which is a function of the change dl of the length l.

The invention utilizes the insight that the output signal in the resistive detection scheme is particularly large when the resonator element extends in a longitudinal direction having a length l and when the elastic deformation comprises a change of length, the ohmic resistance R being a function of the change dl of the length l. In this case the elastic deformation comprises a bulk mode of the resonator element. The ohmic resistance is in first order a linear function of the change of the length and hence of the elastic deformation. This results in a relatively large output signal.

In contrast to this, the output signal is relatively small for resonator elements that are operated in a so-called flex mode. In this case, the resonator element may be attached to the substrate, e.g., at one outer end, the other outer end being free. When such a resonator element is bent, the length of the resonator is in first unchanged order and the signal is therefore relatively small. Alternatively, the resonator element may be attached to the substrate at two points, e.g., its two outer ends. In this case the length does change with the elastic deformation, but the transversal elongation x is not linearly proportional to the electrostatic force F. It can be shown that the force F is related to the transversal elongation x via $F=k_1 \cdot x + k_3 \cdot x^3$ where $k_1$ describes the bending which analogously to the single-sided clamped beam does not contribute to the change in the ohmic resistance, and $k_3$ describes the change of the length, which does change the resistance of the resonator element. This shows that a double-clamped resonator element operated in a flex mode can be read out in the resistive detection scheme only in the nonlinear regime, i.e. the output signal scales with $x^3$. As a consequence of the nonlinear operation, the output signal is relatively small and the energy loss is relatively high resulting in a relatively small Q factor. The Q factor is an important parameter as it determines how well-defined the eigenfrequency of the resonator element is: the larger the Q factor, i.e. the lower the energy loss, the better defined the eigenfrequency. It also determines the amplitude of the periodic deformation: the larger the Q factor, the larger the deformation. Thus, a relatively large Q factor yields a relatively large output signal at a relatively well-defined frequency.

From the article "CMOS chemical microsensors based on resonant cantilever beams" by D. Lange et al., Proceedings of the SPIE conference on smart electronics and MEMS, vol. 3328, p. 233-243, 1998, it is known to exploit the piezoresistive effect for measuring the deformation due to bending of a cantilever in a chemical sensor. The cantilever of the chemical sensor is bent for inducing an elastic deformation, i.e. the elastic deformation comprises a flexural mode. In first order the length of the cantilever is not changed during bending, resulting in only a relatively small change of the resistivity and a corresponding relatively small signal.

In an embodiment of the transducer the resonator element is constituted by a first part having a first length in the longitudinal direction and a second part having a second length in the longitudinal direction, the elastic deformation comprising a change of the first length which is counteracted by a first elastic force, and a change of the second length which is counteracted by a second elastic force, the first elastic force and the second elastic force substantially compensating each other in a deformation-free part of the resonator element, the resonator element being attached to the substrate in a support area comprised in the deformation-free part.

In such a transducer the amount of mechanical energy flowing from the resonator element via the support area into the substrate, i.e. the energy loss, is relatively low because the resonator element is attached to the substrate in a support area which is substantially free of deformations. Therefore, this transducer has a relatively large Q factor and correspondingly a relatively large output signal at a relatively well-defined frequency.

It is often advantageous if the resonator element is substantially mirror-symmetric with respect to an imaginary plane perpendicular to the longitudinal direction and comprised in the deformation-free part. In this case it is possible to use a mirror-symmetric actuator to induce a deformation such that the first elastic force and the second elastic force substantially compensate each other in the deformation-free part.

It is also advantageous if the resonator element has a width in a width direction perpendicular to the longitudinal direction, the length being larger than the width. It is further advantageous if the first resonator element has a height in a height direction perpendicular to the longitudinal direction and to the width direction, the length being larger than the height. The larger the length with respect to the width and the height, the better defined is the eigenmode of the resonator element in which the first length and the second length vary while the other dimensions are unchanged. It is then relatively easy to excite the resonator element in this eigenmode without at the same time exciting other eigenmodes involving the variation of other parameters of the resonator element.

In a variation of the embodiment described above, the support area comprises a first resonator contact and a second resonator contact that is electrically connected to the first resonator contact by a conductive path comprised in the resonator element, the conductive path comprising a point outside the deformation-free part.

In such a transducer the resonator element constituting the resistor can be contacted conveniently because it is not necessary then to electrically contact the resonator element in an area outside the deformation-free part for obtaining a resistance that is a function of the variation of the length. This yields a relatively simple transducer.

It is particularly advantageous if the resonator element has an outer end in the longitudinal direction, the point being at the outer end. In such a transducer the conductive path has a component in the longitudinal direction which is substantially equal to or even larger than the first length or the second length, respectively. Therefore, the change in the first length or the second length, respectively, leads to a relatively large change in the length of the conductive path and thus to a relatively large signal. It is advantageous if the resonator element has a further outer end in the longitudinal direction, the conductive path comprising the point and a further point that is at the further outer end, in that order. In this transducer the change in the first length and the second length leads to an even larger change in the length of the conductive path and thus to an even larger signal.

In an embodiment the resonator element comprises a first material with a first electric conductivity constituting the conductive path and a second material with a second electric conductivity which is smaller than the first electric conductivity, every path from the first resonator contact to the second resonator contact which is free from the point comprising the second material.

The resistance of the resonator element is due to all paths connecting the first resonator contact to the second resonator contact. The resistance of a particular path in relation to the resistances of all other paths determines how much this particular path contributes to the total resistance: a path with a relatively small resistance contributes to a relatively large extent to the total resistance, whereas a path with a relatively large resistance contributes to a relatively small extent to the total resistance. By using a second material with a relatively low conductivity, the resistances of the paths which do not comprise the point is increased resulting in a relatively small contribution to the total resistance. These paths which do not comprise the point comprise among other things those paths that are entirely enclosed in the deformation-free part and therefore do not lead to a resistance which is a function of the deformation. By using the second material, the contribution of the latter paths is reduced and the sensitivity of the transducer is increased.

The lower the conductivity of the second material, the smaller the contribution of the paths which do not comprise the point outside the deformation-free part. It is therefore particularly advantageous if the second material comprises a dielectric material. Preferably, the second material comprises of a dielectric material such as, e.g., silicon dioxide or any other dielectric used in semiconductor device manufacturing. Alternatively, the second material may comprise a gaseous material or vacuum. Such materials have good isolating properties and are easy to include in the resonator element.

The first material may comprise any material that has a conductivity that depends on its deformation. It may comprise all types of metals such as, e.g., copper, aluminum or tungsten. Favorable results are obtained with silicon and other semiconducting materials because these materials have a resistivity which varies relatively strongly as a function of the change of length.

In another embodiment the resonator element is included in a Wheatstone type of electric circuit. This circuit electrically connects a first contact area to a second contact area via a first connection and via a second connection arranged parallel to the first connection, the first connection comprising the resonator element in series with a second resistor, the second connection comprising a third resistor in series with a fourth resistor, the resonator element and the second resistor being connected by a first electrical connector comprising the measurement area, and the third resistor and the fourth resistor being connected by a second electrical connector comprising the reference area.

Such an electric device is similar to a Wheatstone bridge in which one of the four resistors comprises the resonator element. It allows for sensitively measuring the voltage drop over the resonator element. Preferably, the resistances of the four resistors are similar because then the output signal comprises a relatively small DC component and a relatively large AC component which directly measures the deformation. Ideally, the four resistances are substantially identical when the AC component of the electrical actuation potential difference is zero.

It is advantageous if the Wheatstone-type electric circuit comprises the first contact area and the second contact area, the first contact area being electrically connected to the second contact area via a first connection and via a second connection arranged parallel to the first connection, the first connection comprising the resonator element in series with a second resonator element, the second connection comprising a third resonator element in series with a fourth resonator element, the resonator element and the second resonator element being connected by a first electrical connector comprising the measurement area, and the third resonator element and the fourth resonator element being connected by a second electrical connector comprising the reference area, the second resonator element, the third resonator element and the fourth resonator element each being substantially identical to the resonator element.

In this embodiment the second resistor comprises a second resonator element, the third resistor comprises a third resonator element, and the fourth resistor comprises a fourth resonator element, the resonator element, the second resonator element, the third resonator element and the fourth resonator element being substantially identical.

The output signal in the transducer may be subjected to drift of the resistance of any of the four resistors due to, e.g., temperature fluctuations. When all four resistors comprise substantially identical resonator elements, this part of each resistor is changed in a similar way by fluctuations and, therefore, the fluctuations of the output signal are relatively small. Preferably, the four resistors each comprise substantially identical resonator elements because then they have substantially identical resistances which fluctuate substantially in the same way. The signal difference is then substantially independent of the above mentioned fluctuations.

In one embodiment the resonator element is situated between the first contact area and the second resonator element, the third resonator element is situated between the second contact area and the fourth resonator element, and a second electrically conductive actuator is present for elastically deforming the third resonator element. The second actuator is able to receive a second electrical actuation potential difference with respect to the third resonator element. Thereby the second actuator can be capacitively coupled to the third resonator analogously to the coupling between the resonator element and the actuator described above.

In this embodiment the output signal is increased when the second electrical actuation potential difference and the electrical actuation potential difference have a common AC component. The deformations of the resonator element and the third resonator element are then in phase. The deformation of the resonator element modulates the potential of the measurement area, whereas the deformation of the third resonator element modulates the potential of the reference area. Because the resonator element is situated between the first contact area and the second resonator element, and the third resonator element is situated between the second contact area and the fourth resonator element, the modulations of the potential of the measurement area and of the potential of the reference area are in anti phase leading to a larger output signal. Preferably, the actuator and the second actuator are substantially identical and provided with the same actuation potential difference. In this case the output signal is increased by a factor of two.

In a variation of this embodiment, a third electrically conductive actuator is present for elastically deforming the second resonator element, and a fourth electrically conductive actuator is present for elastically deforming the fourth resonator element. The third actuator and the fourth actuator are able to receive a third electrical actuation potential difference with respect to the second resonator element and a fourth electrical actuation potential difference with respect to the fourth resonator element, respectively.

In this embodiment the amplitude of the output signal is increased further. Preferably, the actuator, the second actuator, the third actuator and the fourth actuator are mutually substantially identical. Preferably, the actuator and the second actuator are provided with substantially the same actuation potential difference, whereas the third actuator and the fourth actuator are provided with a further electrical actuation potential difference which is identical to the electrical actuation potential difference but phase-shifted by 90 degrees. In this case the output signal is increased by an additional factor of two. This embodiment combines a relatively high frequency with a relatively high output signal.

It has the additional advantage that temperature fluctuations due to the heating of the resonator elements during operation average out. In general, a resonator element is heated during operation because it is mechanically deformed. This may change the resistance of the resonator element and lead to an uncontrolled change of the output signal. Since in this embodiment all four resonator elements are deformed in the same way, the effect of this heating is compensated and the uncontrolled change of the output signal is reduced.

In one embodiment the transducer is provided with a positive feed-back loop. In operation, the electrical output signal is then locked to the eigenfrequency of the resonator element. This transducer may be used as an oscillator device able to produce an electrical signal with the eigenfrequency of the resonator element. This embodiment of the transducer is suited to replace bulk acoustic wave (BAW) generators such as quartz crystals or surface acoustic wave (SAW) generators. The transducer according to the invention used as an oscillator has the advantage that it is much smaller than the known oscillators and that it can be integrated in integrated circuits. It is particularly suitable for all applications where a small size of the device is important such as, e.g., mobile phones and wrist watches or where the oscillator is to be integrated in an integrated circuit, e.g. in a television set or a radio.

In another embodiment the resonator element comprises a first resonator element and a second resonator element which is mechanically coupled to the first resonator element by a coupling element. The actuator is able to receive the actuation potential difference to elastically deforming the first resonator element. Due to the mechanical coupling, also the second resonator element is elastically deformed in operation. The second resonator element is part of the circuit which is able to provide the output signal. The output signal is a function of the change dl of the length l of the second resonator element. The second resonator element constitutes a resistor with an ohmic resistance R which is a function of the change dl of the length l of the second resonator element. The output signal is a function of the resistance R.

Because the first resonator element and the second resonator element are coupled by the coupling element, this transducer has a resonance with two poles leading to a broader resonance. By coupling several resonator elements in series and detecting the elastic deformation of the last one, a rather broad resonance can be obtained. Such a transducer is suitable as a band-pass filter.

It is advantageous to use the transducer according to the invention in an electronic device comprising a signal processor operating with a clock signal. The transducer is suitable for providing the clock signal and in this way it is possible to replace existing devices such as BAW and SAW generators providing the clock signal, thereby reducing the size of the oscillator and allowing for integration of the oscillator in an integrated circuit. Such an electronic device may be, e.g., a mobile or wireless telephone, a base station for a mobile telephone, a receiver for receiving electromagnetic signals comprising, e.g., a television signal or a radio signal, and a display device comprising a cathode ray tube such as, e.g. a television set or a monitor. All these electronic devices comprise a signal processor operating with a clock frequency.

These and other aspects of the transducer according to the invention will be further elucidated and described with reference to the drawings, in which.

The Figures are not drawn to scale. In general, identical components are denoted by identical reference numerals.

Figure 1:
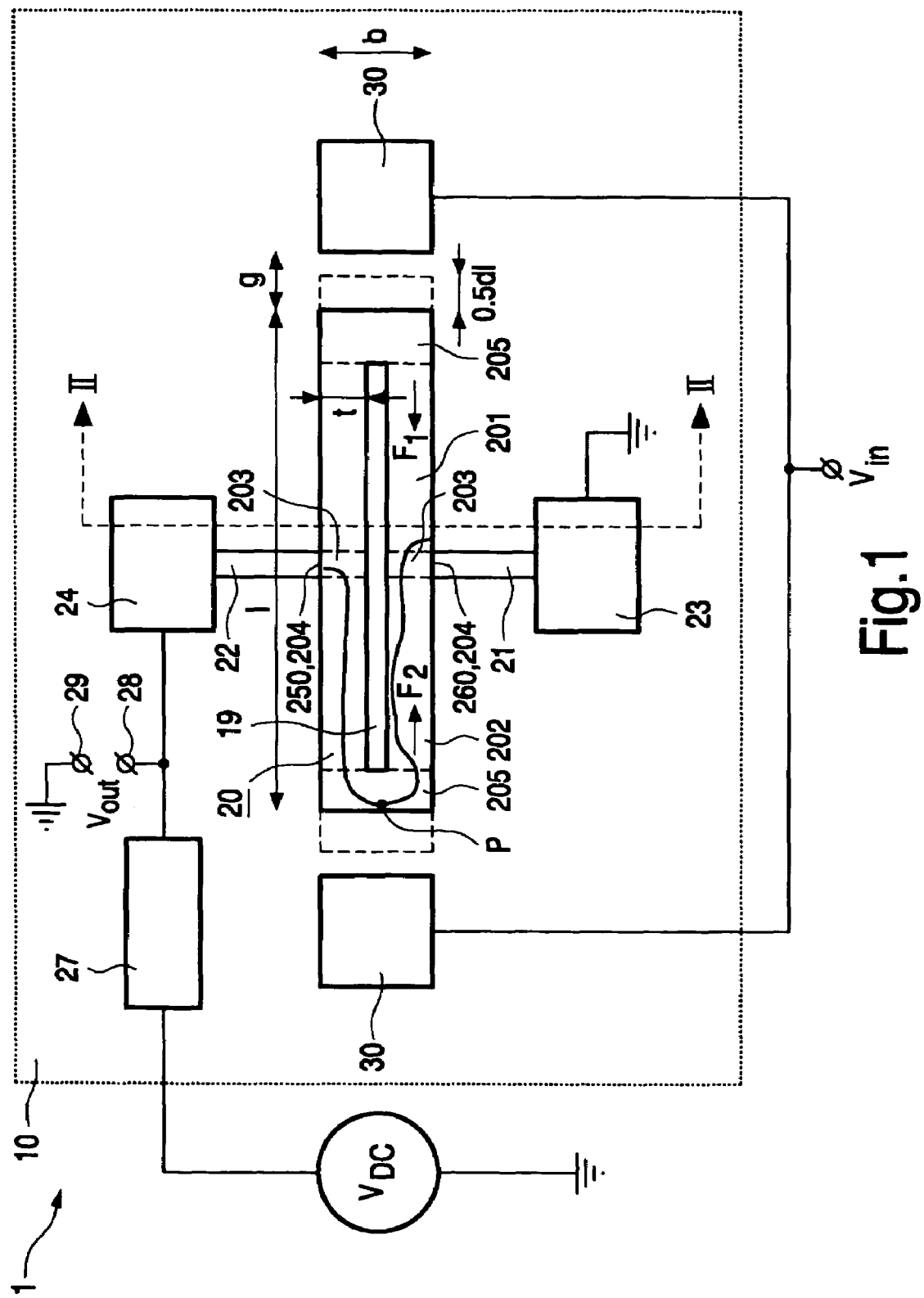
FIG. 1 is a top view of an embodiment of the transducer.

The electromechanical transducer 1 shown in FIG. 1 comprises a substrate 10 which is a silicon wafer. Alternatively, substrate 10 may be a gallium arsenic wafer or it may comprise any other semiconducting, metal or dielectric material. For transducers 1 designed for operation at frequencies above 10 MHz it is advantageous to use a substrate 10 comprising a dielectric such as, e.g., glass, because this reduces the loss of electromagnetic energy dissipated in the substrate.

Figure 2A:
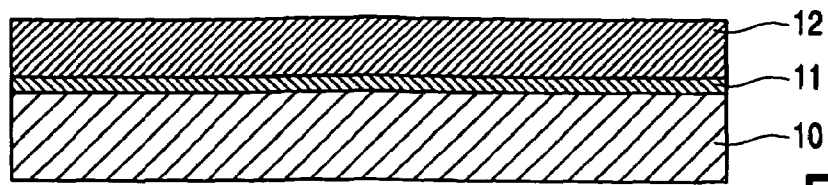
FIGS. 2A-2C are cross-sections of the transducer along II-II in FIG. 1 at various stages of the manufacturing process.
Figure 2B:
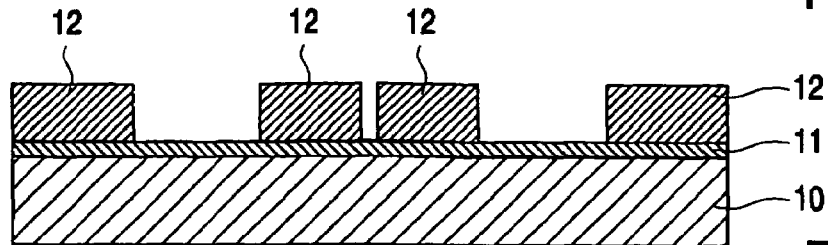
Figure 2C:
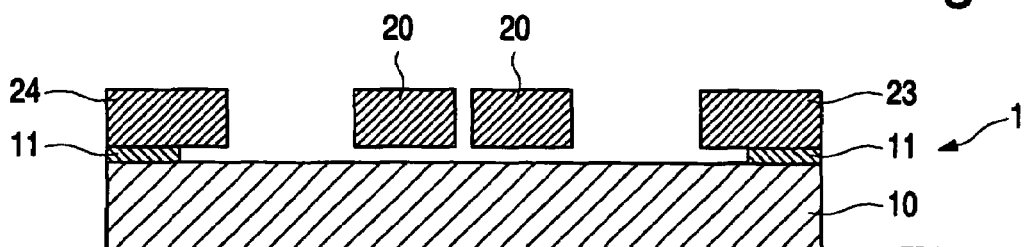

The transducer 1 further comprises an electrically conductive resonator element 20 which extends in a longitudinal direction having a length l. It is attached to the substrate 10 via support elements 21 and 22 which are connected to anchor elements 23 and 24, respectively. The anchor elements 23 and 24 are affixed to the substrate 10 as is shown in FIG. 2C. The resonator element 20 and the support elements 21 and 22 are free from the substrate 10 except for the connection via the anchor elements 23 and 24.

The transducer may be manufactured, e.g., using a technique well known in the field of micro electromechanical systems (MEMS). In short, the substrate 10 is first provided with an oxide layer 11 on top of which a silicon layer 12 is deposited, shown in FIG. 2A. The silicon layer 12 is covered by a photosensitive resist, not shown, which is patterned by, e.g., lithography. The patterned resist is then developed yielding the surface areas of the resonator element 20, the support elements 21 and 22, the anchor elements 23 and 24, and the actuator 30 shown in FIG. 1 covered by the resist while the remaining part of the surface is free from resist. The surface partly covered by the resist is then subjected to etching which selectively removes those parts of the silicon layer 12 that are not covered by the resist. The result of the etching is shown in FIG. 2B. Subsequently, the oxide layer 11 which is exposed due to the previous etching is etched in a second etching step. This etching step removes all exposed parts of oxide layer 11 and, moreover, some of the oxide adjacent to these parts. As a result of the second etching step, the central parts of silicon layer 12 in FIG. 2C are free from the substrate. They form the resonator element 20. At the same etching step also the oxide layer 11 under the support elements 21 and 22 is removed such that the resonator element 20 is attached to the substrate 10 only via the anchor elements 23 and 24.

The resonator element 20 has two outer ends in the longitudinal direction. Each of the outer ends is faced by a respective electrode of the electrically conductive actuator 30. The actuator 30 is able to receive an actuation potential difference VIN with respect to the resonator element 20 for elastically deforming the resonator element 20. The actuation potential difference is a function of the input signal applied to the transducer 1. In addition to the input signal the actuation potential difference may further contain, e.g., a DC component. The elastic deformation comprises a change of the length l by an amount dl shown in FIG. 1.

The resonator element 20 is part of a circuit which is able to conduct an electrical current through the resonator element 20. The resonator element 20 is electrically connected to the positive or negative pole of a DC voltage source $V_{DC}$ via an auxiliary resistor 27, the anchor element 24 and the support element 22. The resonator element 20 is further connected to ground via the support element 21 and the anchor element 23. Therefore, the resonator element 20 is able to conduct an electrical current I. It constitutes a resistor with an ohmic resistance R which causes a voltage drop V when the resonator element 20 conducts the electrical current I.

The resonator element 20 constitutes a resistor with an ohmic resistance R which is a function of the change dl of the length l because the resonator element 20 comprises a central part 19 with open space. The resonator element 20 comprises two mutually parallel beams each of which is affixed to a support element 21 and 22, respectively. The two beams are connected with each other at the two outer ends by elements 205. The central part 19 has been created during the lithography step and the etching step described above. It prevents the current from flowing from the support element 22 to the support element 21 in a straight line. The current has to follow the conductive path formed by the resonator element 20. This conductive path extends in the longitudinal direction.

The circuit is able to produce an output signal which is a function of the change dl of the length l and which is a function of the resistance R. To this end the circuit comprises a measurement point 28 which is electrically connected to the circuit. It is situated between the auxiliary resistor 27 and the anchor element 24, and in operation it produces an electrical output signal which is the electrical potential difference $V_{out}$ between the measurement point 28 and the reference point 29 which is connected to ground.

In an alternative embodiment, not shown, the auxiliary resistor 27 is identical to the resonator element 20. This auxiliary resistor 27 is attached to the substrate 10 via anchor elements and support elements analogous to the resonator element 20. It is provided with an actuation potential difference by an actuator similar to the actuator 30. The actuation potential difference provided by this actuator with respect to the resonator element of the auxiliary resistor 27 is substantially identical to that provided by the actuator 30 with respect to the resonator element 20, but shifted in phase by 180 degrees. In this embodiment the measurement point 28 situated between the auxiliary resistor 27 and the anchor element 24 provides an output signal that is increased by a factor of two.

In another alternative embodiment, not shown, the auxiliary resistor 27 is not situated between the voltage source and the anchor element 24, but instead between the anchor element 23 and ground. In this case the measurement point 28 is situated between the auxiliary resistor 27 and the anchor element 23.

In yet another embodiment, not shown either, the DC voltage source $V_{DC}$ and the auxiliary resistor 27 are omitted. The anchor element 24 is connected to the positive pole of a current source and the anchor element 23 is connected to the negative pole of the current source. The measurement point 28 is situated between the positive pole of the current source and the anchor element 24, and the reference point 29 is situated between the anchor element 23 and the negative pole of the current source. Also in these embodiments the output signal is a function of the change dl of the length l as will be understood by those skilled in the art.

The resonator element 20 is constituted by a first part 201 having a first length in longitudinal direction and a second part 202 having a second length in longitudinal direction. In the embodiment shown in FIG. 1 the first length is equal to the second length and given by 0.5·l. In another embodiment, not shown, the first length is different from the second length. It may be, e.g. 0.25·l. In yet another embodiment, not shown either, the second part 202 is omitted. The elastic deformation comprises a change of the first length which is counteracted by a first elastic force $F_1$ and a change of the second length which is counteracted by a second elastic force $F_2$. Because the actuator 30 comprises two substantially identical electrodes, each one is separated from an outer end of the resonator element 20 by substantially the same gap g, the first elastic force $F_1$ and the second elastic force $F_2$ substantially compensating each other in the deformation-free part 203 which is situated in the middle of the resonator element 20. The resonator element 20 is attached to the substrate 10 via the support elements 21 and 22 in the support areas 204 located in the deformation-free part 203. In this way the flow of mechanical energy is limited and the Q-factor is relatively high, leading to a relatively large signal.

The support area 204 has a first resonator contact 250 and a second resonator contact 260 that is electrically connected to the first resonator contact 250 by a conductive path contained in the resonator element 20. This conductive path has a point P outside the deformation free part 203 and inside element 205. The resonator element 20 has an outer end in the longitudinal direction and the point P is at the outer end.

The resonator element 20 shown in FIG. 1 comprises a first material with a first electric conductivity constituting the conductive path and a second material with a second electric conductivity which is smaller than the first electric conductivity. In this embodiment the first material is silicon and the second material comprises a dielectric material which is air. The silicon may comprise crystalline silicon with a crystal orientation [110], [111] or [100].

Alternatively, the transducer 1 may be encapsulated such that the second material comprises a low-pressure gas with a pressure below 1 Pa which has the advantage that the central part 19 is substantially free from any contamination which otherwise may lead to unwanted electrical short-circuits. In another embodiment described below the second material comprises a dielectric which is solid. Because of the central part 19, every path from the first resonator contact 250 to the second resonator contact 260 which is free from the point P comprises the second material.

Figure 3:
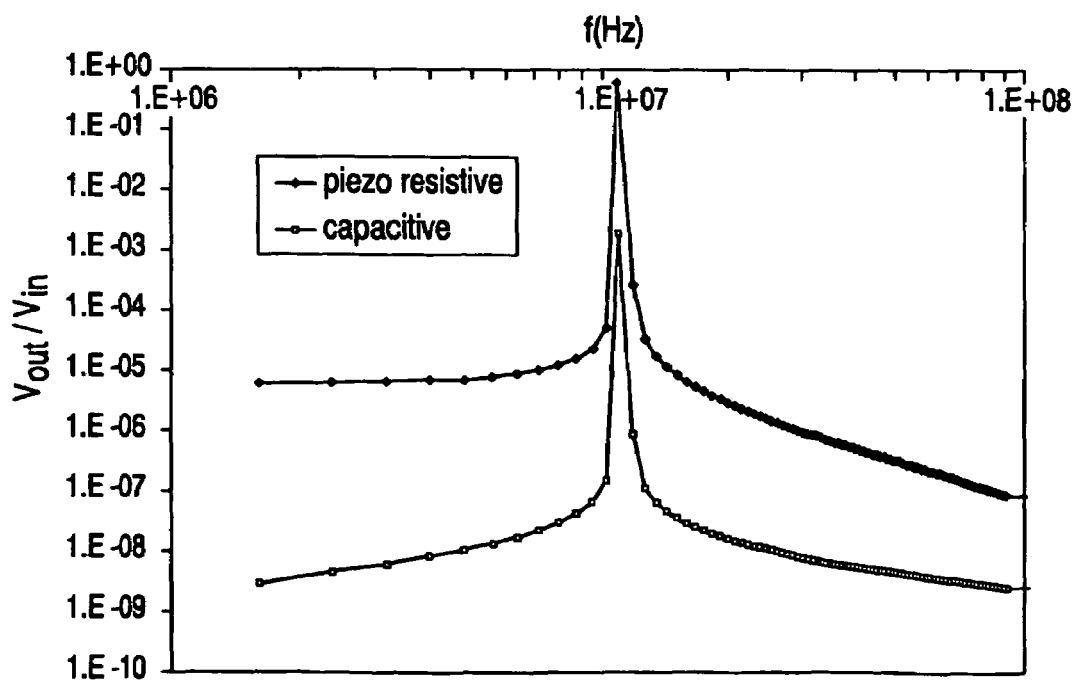
FIG. 3 is a plot of the transmittance of the transducer according to the invention and that of the known transducer.

For a resonator element 20 with a length l=360 μm, a width b=8 μm and a thickness t shown in FIG. 1 of t=2.67 μm and a height h=10 μm, the eigenfrequency of the beam is approximately 12 MHz. The output signal normalized by the input signal, i.e. the transmittance of the transducer 1 according to the invention shown in FIG. 3 is larger than that of the known transducer also shown in FIG. 3 by more than a factor of 100. Both transmittances apply to a transducer with a gap g=1 μm and a DC component of the actuation potential difference of 100 V.

Figure 4:
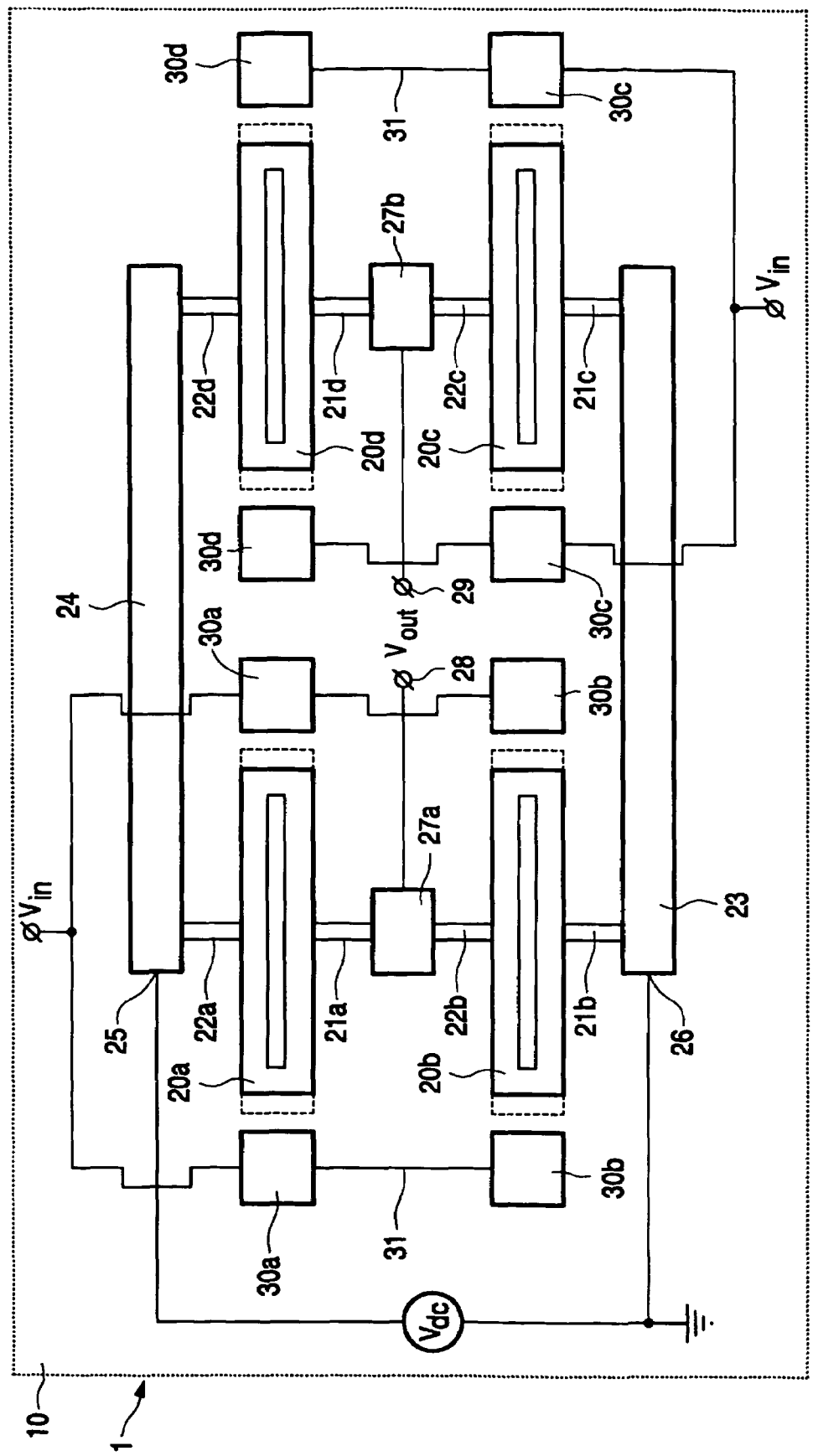
FIG. 4 is a top view of another embodiment of the transducer.

In the embodiment of the transducer 1 shown in FIG. 4, the resonator element 20a, which is identical to the resonator element 20 of FIG. 1, is included in a Wheatstone type of electric circuit. The Wheatstone type of electric circuit comprises the first contact area 25 and the second contact area 26. The first contact area 25 is electrically connected to the second contact area 26 via a first connection and via a second connection arranged parallel to the first connection.

The first connection comprises the support elements 21a and 22a and the resonator element 20a in series with a second resistor which is constituted by a second resonator element 20b. The second connection comprises a third resistor which is constituted by a third resonator element 20c in series with a fourth resistor which is constituted by a fourth resonator element 20d.

The resonator elements 20a, 20b, 20c and 20d are attached to the substrate 10 via the anchor element 27a and 27b and the respective support elements 21a, 21b, 21c and 21d, and 22a, 22b, 22c, 22d.

The resonator element 20a and the second resonator element 20b are connected by a first electrical connector formed by the support elements 21a and 22b and by the anchor element 27a. The first electrical connector comprises the measurement point 28. The third resonator element 20c and the fourth resonator element 20d are connected by a second electrical connector formed by the support elements 21c and 22d and by the anchor element 27b, the second electrical connector comprises the reference point 29. The second resonator element 20b, the third resonator element 20c and the fourth resonator element 20d are each substantially identical to the resonator element 20a. Ideally, the support elements 21a, 21b, 21c and 21d are substantially identical, and the support elements 22a, 22b, 22c and 22d are substantially identical as well.

The resonator element 20a is situated between the first contact area 25 and the second resonator element 20b. The third resonator element 20c is situated between the second contact area 26 and the fourth resonator element 20d. A second electrically conductive actuator 30c, which is substantially identical to the actuator 30a, is present for elastically deforming the third resonator element 20c. The actuators 30a and 30c are able to receive substantially the same actuation potential difference with respect to the resonator elements 20a and 20c for elastically deforming the resonator elements 20a and 20c, respectively.

The transducer 1 further comprises a third electrically conductive actuator 30b for elastically deforming the second resonator element 20b, and a fourth electrically conductive actuator 30d for elastically deforming the fourth resonator element 20d. The third actuator 30b and the actuator 30a, and the fourth actuator 30d and the second actuator 30c are connected to by connectors 31 which are designed to induce a delay of approximately 90 degrees for an AC signal with a frequency which is substantially identical to the eigenfrequency of the resonator element 20a.

In another embodiment, not shown, the third actuator 30b and the fourth actuator 30d are omitted. In yet another embodiment, not shown either, the second actuator 30c is omitted as well. In a variation of the latter embodiment, the resonator elements 20b, 20c and 20d are replaced by ohmic resistors, each of which preferably having a resistance substantially identical to the ohmic resistance R of the resonator element 20a.

Figure 5A:
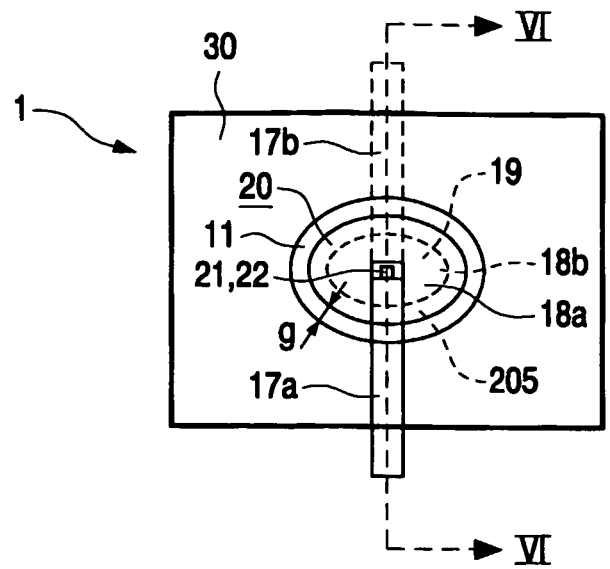
FIGS. 5A and 5B are top views of two other embodiments of the transducer.
Figure 5B:
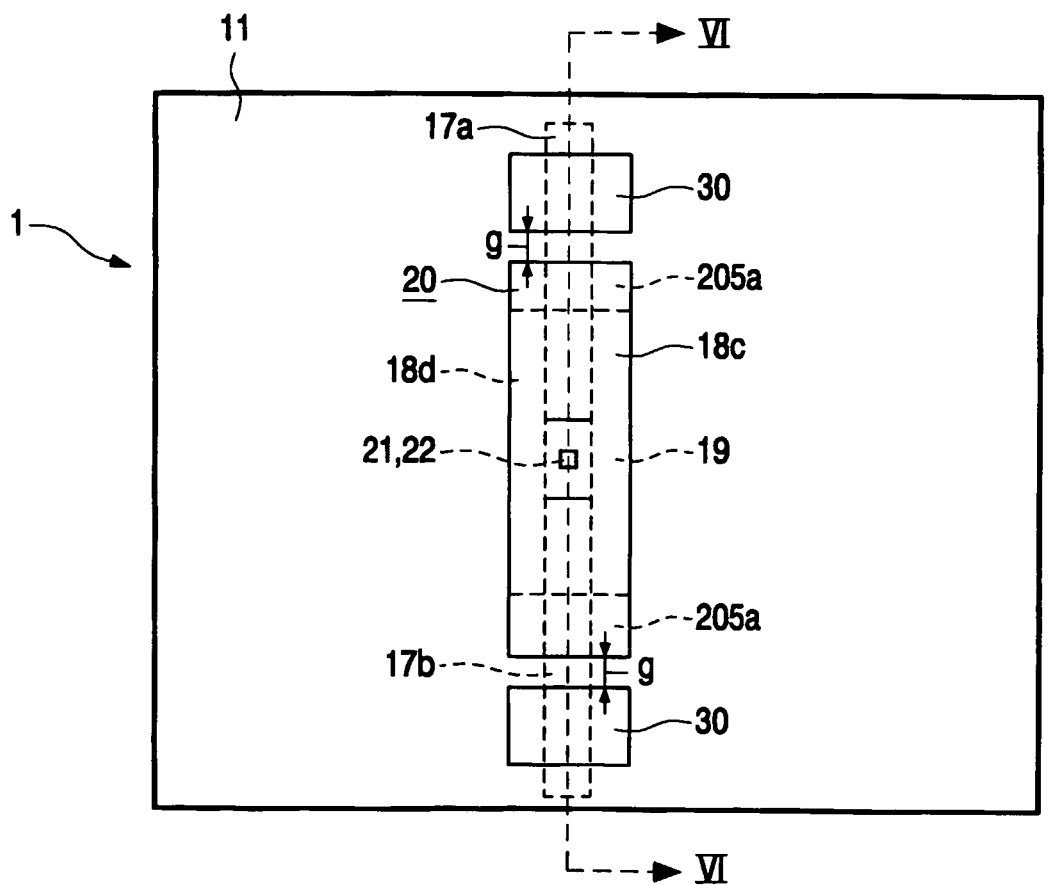

In another embodiment shown in FIGS. 5A and 5B the resonator element 20 is attached to the substrate 10 via support elements 21 and 22 in a direction perpendicular to the main surface of the substrate 10. In these embodiments the central part 19 of resonator element 20 is filled with a dielectric such as, e.g., silicon oxide or silicon nitride. For relatively small central parts 19 with dimensions in the order of μm or smaller, it is often difficult to create the open space 19 by etching, without either leaving behind residuals of the etching agent or, when removing the etching agent, creating a contact between the two parallel beam forming the resonator element 20. By filling the central part 19 with a dielectric during the manufacturing process described below these difficulties can be avoided.

In the embodiment shown in FIG. 5A the resonator element 20 has a circular shape with a radius r and it is radially surrounded by the actuator 30 constituting a ring-shaped gap g. The actuator 30 is able to receive an electrical actuation potential difference with respect to the resonator element 20 for elastically deforming the resonator element 20 in the radial direction, i.e. in a contour mode. It should be noted that also this type of resonator element 20 extends in a longitudinal direction having a length l: the longitudinal direction may be any radial direction and the length l in this direction is identical to the radius r. The elastic deformation comprises a change of the length dl, which is identical to the change in the radius dr. Such a resonator element is particularly suited for relatively high frequencies, e.g., above 10 MHz or even above 150 MHz. It has a relatively high Q-factor which may be above 7000 or even higher.

The resonator element 20 is composed of circular mutually parallel plates 18a and 18b whose outer ends are mutually electrically connected by a ring-shaped element 205. Encapsulated by the circular elements 18a and 18b, and by the ring-shaped element 205 is a circular dielectric area which constitutes the central part 19 of the resonator element 20. The upper circular plate 18a and the lower circular plate 18b are electrically connected to conductor 17a and 17b by support elements 21 and 22, respectively. In this way the resonator element 20 constitutes an ohmic resistor with a resistance R which is a function of the actual radius r+dr which corresponds to the length l+dl.

In an alternative embodiment shown in FIG. 5B the resonator element 20 is radial. It is composed of rectangular, mutually parallel plates 18c and 18d whose outer ends in longitudinal direction are connected by rectangular elements 205a. The parts of the rectangular plates 18c and 18d, which are free from the rectangular elements 205a, are separated by a central part 19 which comprises silicon nitride. In contrast to the embodiment shown in FIG. 5A the central part 19 is not entirely encapsulated here. Analogous to the embodiment shown in FIG. 5A the transducer 1 further comprises conductors 17a and 17b and support elements 21 and 22 for contacting the resonator element 20 to constitute a resistor. It further comprises actuators 30 similar to those shown in FIG. 1.

Figure 6A:
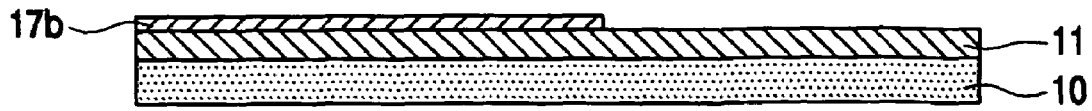
FIGS. 6A-6H are cross-sections of the transducer along VI-VI in FIGS. 5A and 5B at various stages of the manufacturing process.

The transducer 1 shown in FIGS. 5A and 5B may be manufactured by the following method. The transducer 1 according to VI-VI in FIGS. 5A and 5B is shown at various stages of the manufacturing process in FIGS. 6A-6H. The substrate 10 is first covered by a dielectric layer 11 which may comprise, e.g., silicon nitride. On top of dielectric layer 11 conductor 17b is formed, e.g., by depositing a layer of polycrystalline silicon which is patterned by lithography and etching. The result of these steps is shown in FIG. 6A.

Figure 6B:
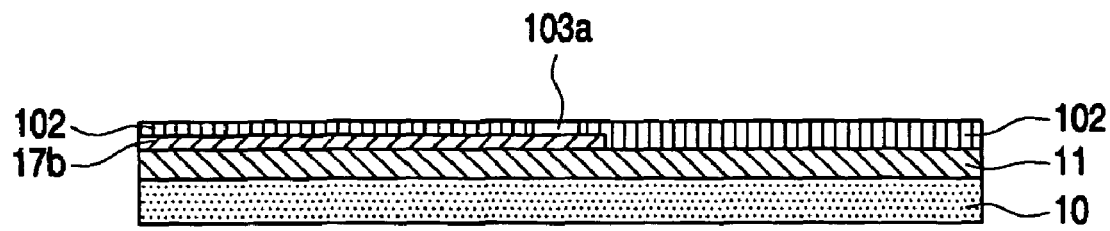
Figure 6C:
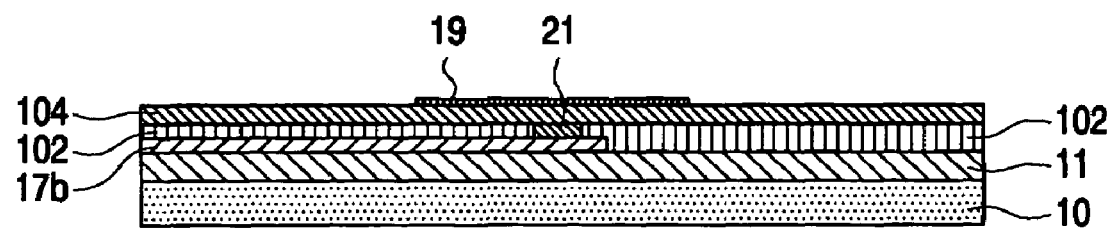
Figure 6D:
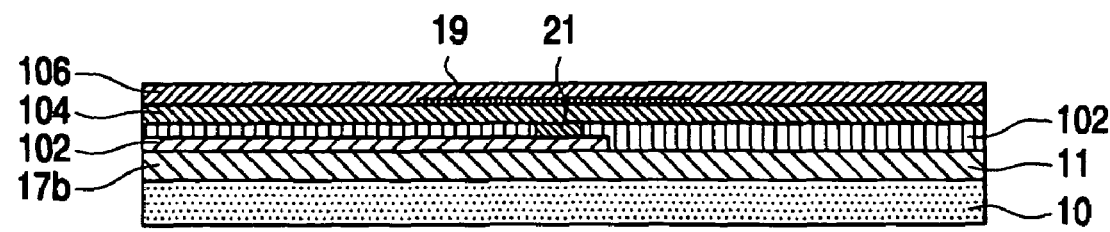

Subsequently, a further dielectric layer 102 of, e.g., silicon dioxide is deposited and an opening 103a in it, shown in FIG. 6B, is created to expose a part of conductor 17b. Then, a film 104 of polycrystalline silicon is deposited to cover dielectric layer 102 thereby filling the opening 103a and creating support element 21. On top of film 104 an additional dielectric layer is deposited of which the central part 19, shown in FIG. 6C, is formed using, e.g., lithography and etching. On top of this structure a further film 106 of polycrystalline silicon is deposited, shown in FIG. 6D.

Figure 6E:
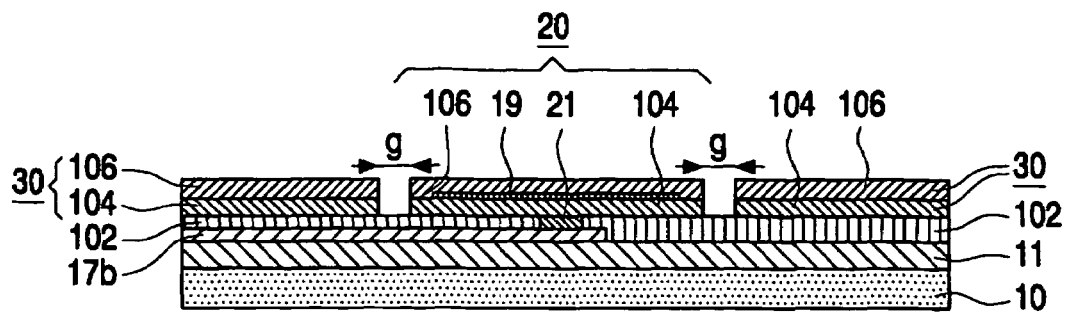
Figure 6F:
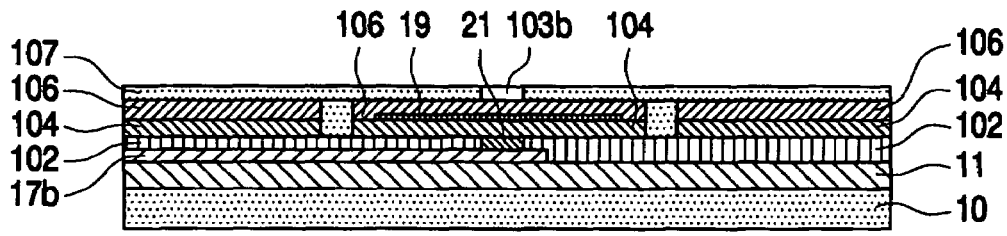
Figure 6G:
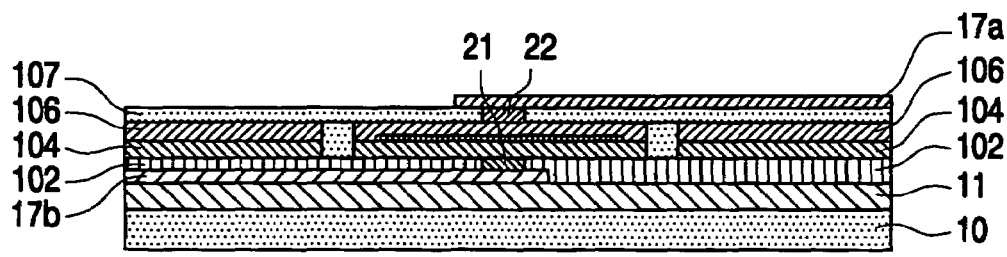
Figure 6H:
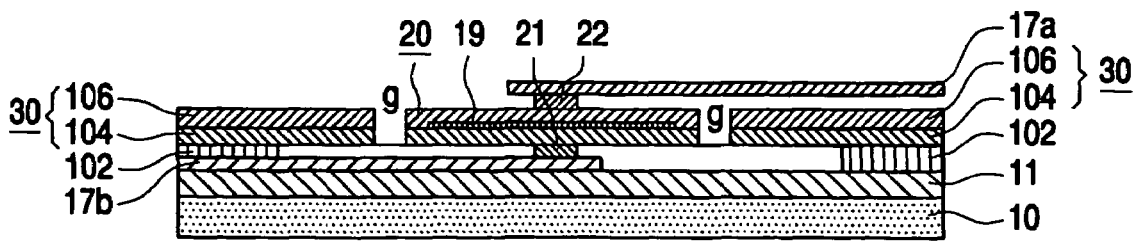

In a next step the resonator element 20 and the actuators 30 are formed from layers 104 and 106 and from the central part 19 by etching away the polycrystalline silicon in all regions free of the resonator element 20 and the actuators 30, thereby defining the gap g, shown in FIG. 6E. On top of this structure, a next dielectric layer 107 comprising silicon dioxide is deposited and an opening 103b in it, shown in FIG. 6F, is formed to expose a part of layer 106 which is part of the resonator element 20. Then, an electrically conducting film of, e.g., aluminum, tungsten, copper or polycrystalline silicon is deposited to cover dielectric layer 104 thereby filling the opening 103b and creating support element 22. From this metal film conductor 17a, shown in FIG. 6G, is then formed by lithography and etching. Finally, most parts of dielectric layers 102 and 107 are etched away, yielding the transducer 1 shown in FIGS. 5A and 5B, respectively. When manufacturing the transducer 1 shown in FIG. 5B, which has a central part 19 filled with a dielectric material, it is essential that this dielectric material be different from that of dielectric layers 102 and 107 and that the latter layers can be etched selectively with respect to the dielectric material of the central part 19. For this reason the central part 19 is made of silicon nitride, whereas layers 102 and 107 comprise silicon dioxide.

Figure 7:
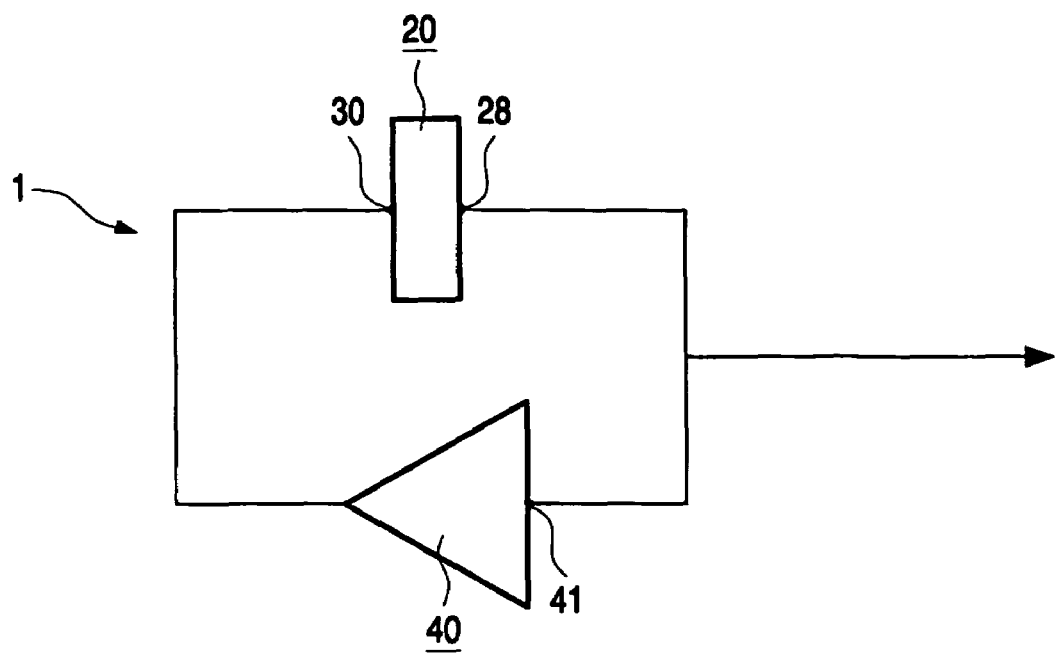
FIG. 7 is a schematic diagram of a further embodiment of the transducer.

The transducer 1 shown schematically in FIG. 7 comprises an amplifier 40 with an input terminal 41 which is electrically connected to the measurement point 28 of a transducer according to the invention. The amplifier 40 is able to amplify the AC component of the electrical signal provided by the measurement point 29 and to provide the amplified signal to the actuator 30. The amplifier 40 is provided with a phase shifter able to shift the phase of the amplified signal such that the amplified signal at the actuator 30 is in phase with the deformation of the resonator element 20. In this embodiment, the transducer 1 is thus provided with a positive feed-back loop. In operation, the electrical output signal is therefore locked on to the eigenfrequency of the resonator element 20. This transducer 1 may be used as an oscillator device able to produce an electrical signal with the eigenfrequency of the resonator element 20.

The transducer 1 shown in FIG. 7 can be used for providing an electric signal with a predetermined frequency which is equal to the eigenfrequency of the resonator element 20. Alternatively, the transducer 1 shown in FIG. 1 or FIG. 5A or 5B may be used, in which the actuator 30 is provided with an actuation potential difference from a voltage source able to generate a signal $V_{IN}$ with an adjustable frequency where this frequency is adjusted via a feedback circuit connected to the measurement point 28.

Figure 8:
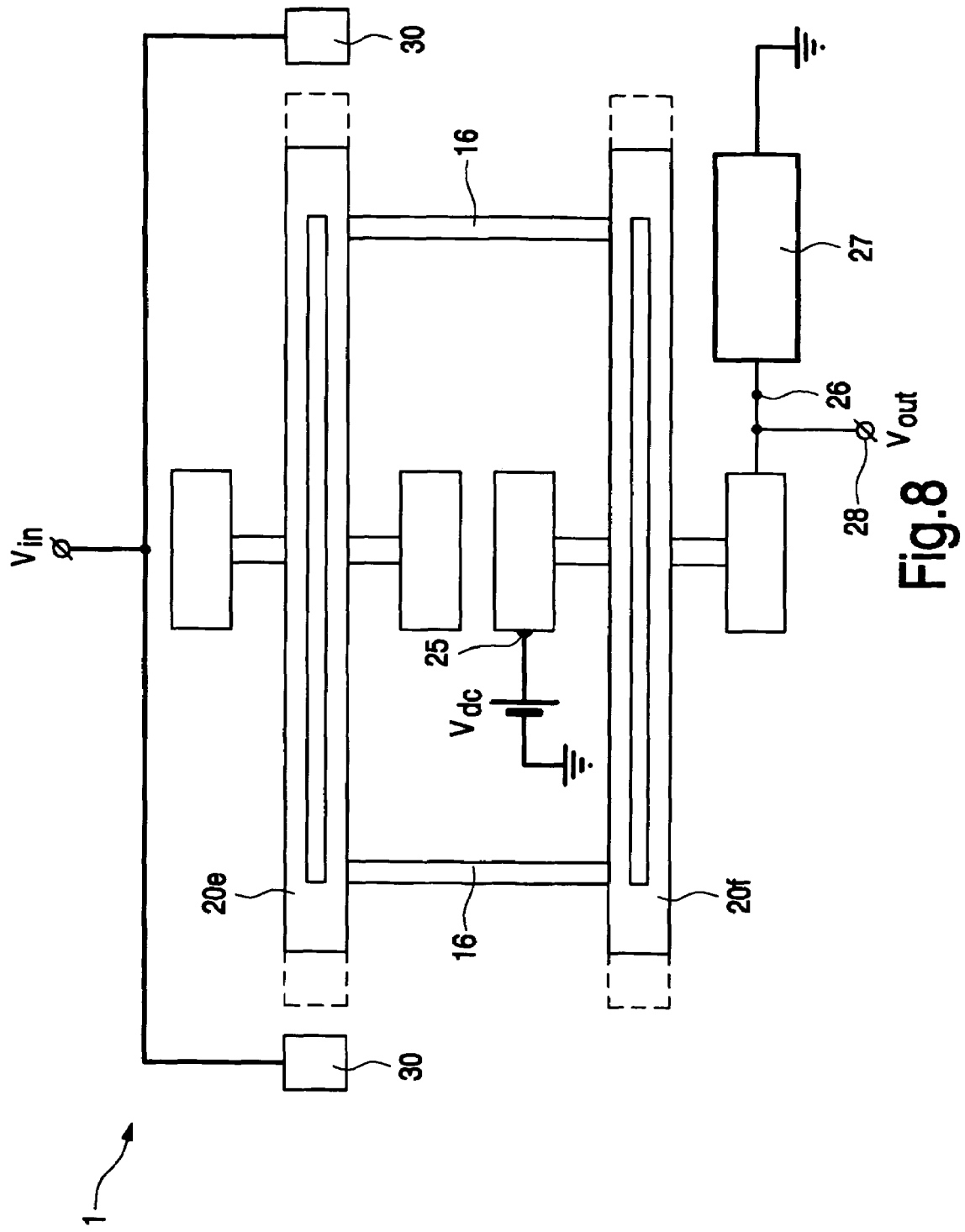
FIG. 8 is a schematic diagram of a yet another embodiment of the transducer.

The transducer 1 shown schematically in FIG. 8 comprises a first resonator element 20e and a second resonator element 20f. Each of the resonator elements 20e and 20f is substantially identical to and attached to the substrate 10 in the same way as the resonator element 20 shown in FIG. 1. The first resonator element 20e and the second resonator element 20f are mechanically coupled by a coupling element 16 which is attached to these two elements and free from the substrate. The actuator 30 is arranged such that it is able to induce an elastic deformation of the first resonator element 20e. When the first resonator element 20e is brought into resonance by actuator 30, it induces a resonant motion of the second resonator element 20f because of the coupling elements 16. The resonant motion of the second resonator element 20f can be detected using the resistive detection scheme described above. To this end the second resonator element 20e is part of the circuit shown in FIG. 8 which is able to provide the output signal. The output signal is a function of the change dl' of the length l' of the second resonator element 20f. The second resonator element 20f constitutes a resistor with an ohmic resistance R' which is a function of the change dl' of the length l' of the second resonator element 20f, analogous to the transducer shown in FIG. 1. The output signal is a function of the resistance R'. Because the first resonator element 20e and the second resonator element 20f are coupled by the coupling element 16, the transducer 1 has a broader resonance with relatively steep edges. By coupling several resonator elements 20 in series and detecting the elastic deformation of the last one, a rather broad resonance can be obtained. Such a transducer is suitable as a filter. When it is provided with an electric input signal $V_{IN}$ as the actuation potential difference, it produces a detectable electrical output signal at the measurement point 28 only for those input signal components having a frequency that is within the resonance of the transducer 1. For providing the electrical output signal the transducer 1 comprises an auxiliary resistor 27 analogous to the transducer 1 shown in FIG. 1.

Figure 9:
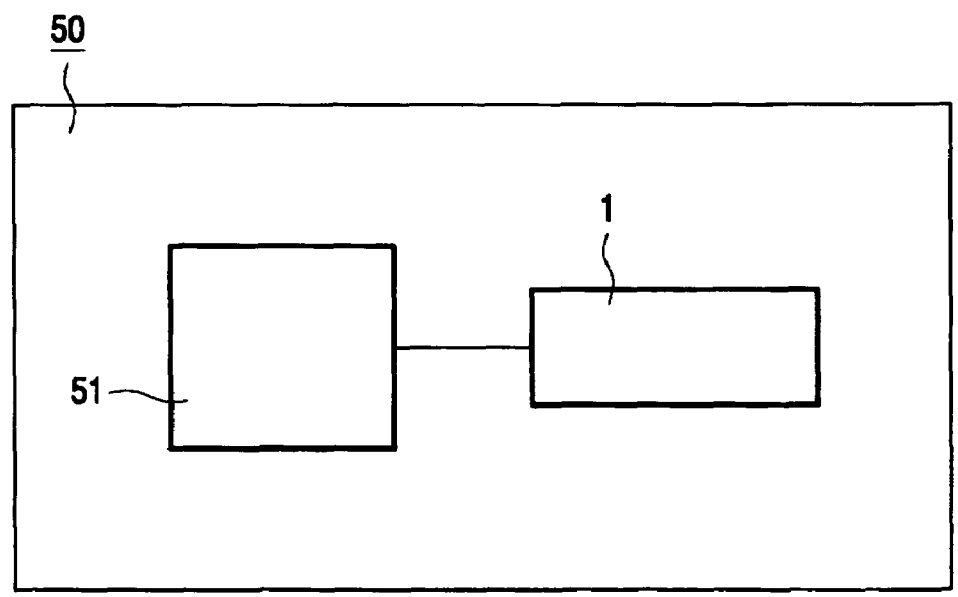
FIG. 9 is a schematic diagram of an electronic device.

The electronic device 50 shown in FIG. 9 comprises a signal processor 51 operating with a clock signal. The clock signal is provided by the transducer 1 as shown in FIG. 1.

Summarizing, the transducer 1 comprises an electrically conductive resonator element 20 extending in a longitudinal direction having a length l. It can be elastically deformed by an electrically conductive actuator 30 such that the elastic deformation comprises a change of the length dl. The resonator element 20 is electrically connected to a first contact area 25 and a second contact area 26 thereby constituting a circuit. In this circuit the resonator element 20 constitutes a resistor with an ohmic resistance R that is a function of the length l+dl. The transducer 1 further comprises a measurement point 28 electrically connected to the circuit for providing an electrical signal which is a function of the resistance R.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The verb "comprise" and its conjugations do not exclude the presence of other elements or steps than those listed in a claim. The word "a" or "an" preceding an element does not exclude the presence of a plurality of such elements.

The invention claimed is:

1. An electromechanical transducer for transducing an electrical input signal into an electrical output signal, the transducer comprising:
   a substrate,
   an electrically conductive resonator element attached to the substrate, the resonator element extending in a longitudinal direction having a length, the resonator element including a deformation-free part, a first part that extends a first length from one side of the deformation-free part in the longitudinal direction, and a second part that extends a second length from the other side of the deformation-free part in the longitudinal direction, the resonator element being attached to the substrate only in the deformation-free part, and
   an electrically conductive actuator able to receive an electrical actuation potential difference with respect to the resonator element for inducing an elastic deformation of the resonator element, the actuation potential difference being a function of the input signal, the elastic deformation comprising a change of the length, the resonator element comprising a resistor with an ohmic resistance which is a function of the change of the length, the output signal being a function of the resistance.

2. A transducer as claimed in claim 1, wherein the elastic deformation includes a change of the first length which is counteracted by a first elastic force, and a change of the second length which is counteracted by a second elastic force, the first elastic force and the second elastic force substantially compensating each other in the deformation-free part of the resonator element, and wherein the deformation-free part includes a support area that attaches the resonator element to the substrate.

3. A transducer as claimed in claim 2, wherein the support area includes a first resonator contact and a second resonator contact that is electrically connected to the first resonator contact by a conductive path comprised in the resonator element, the conductive path comprising a point outside the deformation-free part.

4. A transducer as claimed in claim 3, wherein the resonator element has an outer end in the longitudinal direction, the point being at the outer end.

5. A transducer as claimed in claim 3, wherein the resonator element includes a first material with a first electric conductivity constituting the conductive path, and a second material with a second electric conductivity which is smaller than the first electric conductivity, and wherein every path from the first resonator contact to the second resonator contact which is free from the point comprising the second material.

6. A transducer as claimed in claim 5, wherein the second material is a dielectric material.

7. A transducer as claimed in claim 1, wherein the resonator element is included in a Wheatstone-type electric circuit, the Wheatstone-type electric circuit comprises a first contact area and a second contact area, the first contact area being electrically connected to the second contact area via a first connection and via a second connection arranged parallel to the first connection, the first connection comprising the resonator element in series with a second resonator element, the second connection comprising a third resonator element in series with a fourth resonator element, the resonator element and the second resonator element being connected by a first electrical connector comprising a measurement point, and the third resonator element and the fourth resonator element being connected by a second electrical connector comprising a reference point, the output signal comprising an electrical potential difference between the measurement point and the reference point, the second resonator element, the third resonator element and the fourth resonator element each being substantially identical to the resonator element.

8. A transducer as claimed in claim 7, wherein:
   the resonator element is situated between the first contact area and the second resonator element,
   the third resonator element is situated between the second contact area and the fourth resonator element, and
   a second electrically conductive actuator for elastically deforming the third resonator element is present.

9. A transducer as claimed in claim 8, wherein:
   a third electrically conductive actuator for elastically deforming the second resonator element is present, and
   a fourth electrically conductive actuator for elastically deforming the fourth resonator element is present.

10. A transducer as claimed in claim 1, wherein:
    the resonator element comprises a first resonator element and a second resonator element, the first resonator element and the second resonator element being mechanically coupled by a coupling element,
    the actuator is able to induce an elastic deformation of the first resonator element, and
    the second resonator element constitutes a resistor with an ohmic resistance which is a function of the change of the length of the second resonator element, the output signal being a function of the resistance of the second resonator element.

11. An electronic device comprising:
    a signal processor operating with a clock signal, and
    a transducer as claimed in claim 1 for providing the clock signal.

12. A transducer as claimed in claim 1, wherein the first part of the resonator element includes two parallel conductive elements that are separated from each other by a dielectric material and a first conductive end element that connects the two parallel elements of the first part to each other, the two parallel conductive elements of the first part extending from the one side of the deformation-free part in the longitudinal direction to the first conductive end element.

13. A transducer as claimed in claim 12, wherein the deformation-free part includes a first resonator contact and a second resonator contact that is electrically connected to the first resonator contact by a conductive path that includes the two parallel conductive elements of the first part and the first conductive end element.

14. A transducer as claimed in claim 13, wherein the second part of the resonator element includes two parallel conductive elements that are separated from each other by the dielectric material and a second conductive end element that connects the two parallel elements of the second part to each other, the two parallel conductive elements of the second part extending from the other side of the deformation-free part in the longitudinal direction to the second conductive end element.

* * * * *